(12) United States Patent
Norimatsu (10) Patent No.: US 6,556,848 B2
(45) Date of Patent: Apr. 29, 2003

(54) POWER AMPLIFIER

(75) Inventor: Hidehiko Norimatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/999,396

(22) Filed: Oct. 31, 2001

(65) Prior Publication Data

US 2002/0055376 A1 May 9, 2002

Related U.S. Application Data

(62) Division of application No. 09/291,676, filed on Apr. 14, 1999.

(30) Foreign Application Priority Data

Apr. 27, 1998 (JP) ............................................. 10/116497

(51) Int. Cl.[7] .......................... H04B 1/38; H04Q 11/12
(52) U.S. Cl. ........................ 455/575; 455/126; 455/127
(58) Field of Search ............................. 455/73, 76, 78, 455/84, 86, 90, 575, 550, 552, 127, 553, 126

(56) References Cited

U.S. PATENT DOCUMENTS

| 4,061,984 A | 12/1977 | Zirwas |
| 5,177,450 A | 1/1993 | Lee et al. |
| 5,603,097 A | * 2/1997 | Kanou ............................. 455/86 |
| 5,991,603 A | * 11/1999 | Aoki et al. ..................... 455/84 |

FOREIGN PATENT DOCUMENTS

| JP | 54-51359 | 4/1979 |
| JP | 5-11517 | 2/1993 |
| JP | 5-243862 | 9/1993 |
| JP | 7-202595 | 8/1995 |
| JP | H07-336168 | 12/1995 |
| JP | 8-307159 | 11/1996 |
| JP | 10-145162 | 5/1998 |
| JP | HEI 1-117405 | 5/1999 |

* cited by examiner

Primary Examiner—Thanh Cong Le
(74) Attorney, Agent, or Firm—Scully, Scott, Murphy & Presser (57) ABSTRACT

In a power amplifier for amplifying power using a transistor, the transistor includes a plurality of transistor units connected in parallel and having different static characteristics or pinch-off voltages. When a bias voltage applied to the plurality of transistor units is lowered, predetermined transistor units of the plurality of transistor units are turned off by pinch-off, and the remaining transistor units are in an ON state.

3 Claims, 6 Drawing Sheets

POWER AMPLIFIER

CROSS REFERENCE TO RELATED APPLICATION

The present application is a divisional of application Ser. No. 09/291,676, filed on Apr. 14, 1999.

BACKGROUND OF THE INVENTION

1. Field of the Invention

The present invention relates to a power amplifier and, more particularly, to an amplifier which uses transistors with a new structure to realize size reduction without decreasing the efficiency in a low output mode.

2. Description of the Prior Art

Generally, when a radio signal is to be transmitted from a radio device, the transmission signal is amplified by a power amplifier and output at power with a desired strength. For such a power amplifier, lower power consumption and higher efficiency are required.

As conventional amplifiers with low power consumption, there are an operational amplifier disclosed in Japanese Unexamined Patent Publication No. 1-117405, an FET amplifier circuit disclosed in Japanese Unexamined Patent Publication No. 5-243862, and an inverter amplifier disclosed in Japanese Unexamined Patent Publication No. 7-202595.

When the conventional power amplifier is used while continuously changing its output, generally, the magnitude of the bias voltage is decreased and, more specifically, in a bipolar transistor, the base voltage is lowered to decrease the output.

However, when the base voltage is lowered, the efficiency of the power amplifier lowers. The efficiency can be improved by adjusting the collector voltage.

However, to adjust the collector voltage, a larger current than that for adjusting the gate voltage is required. When power consumption for the maximum power of the power amplifier is taken into consideration, a power device with a considerably large size must be used.

Hence, the apparatus using the power amplifier excessively becomes bulky. Such a power amplifier is very disadvantageous for application to an apparatus such as a portable telephone having a limited space and requiring size reduction.

SUMMARY OF THE INVENTION

The present invention has been made in consideration of the above-described problem, and has as its object to provide a power amplifier which uses transistors with a new structure to realize size reduction without decreasing the efficiency in a low output mode.

In order to achieve the above object, according to the first aspect of the present invention, there is provided a power amplifier for amplifying power using a transistor, wherein the transistor comprises a plurality of transistor units connected in parallel and having different static characteristics.

According to the second aspect of the present invention, there is provided a power amplifier wherein the static characteristic is a pinch-off voltage.

According to the third aspect of the present invention, there is provided a power amplifier for amplifying power using a transistor, wherein the transistor comprises a plurality of transistor units connected in parallel and having different pinch-off voltages, and when a bias voltage applied to the plurality of transistor units is lowered, predetermined transistor units of the plurality of transistor units are turned off by pinch-off, and the remaining transistor units are in an ON state.

According to the fourth aspect of the present invention, there is provided a power amplifier wherein the plurality of transistor units of the first or third aspect are connected in parallel through a matching circuit.

According to the fifth aspect of the present invention, there is provided a power amplifier wherein each of the plurality of transistor units of any one of the first, third, and fourth aspects comprises a transistor group constructed by a plurality of transistors.

According to the sixth aspect of the present invention, there is provided a power amplifier wherein the transistor group of the fifth aspect is constructed by a plurality of FETs.

According to the seventh aspect of the present invention, there is provided a power amplifier for amplifying power using a transistor, wherein the transistor comprises a plurality of transistor units connected in parallel and having different pinch-off voltages, each of the plurality of transistor units comprises a transistor group having a plurality of transistors, when a bias voltage applied to the plurality of transistor units is lowered, predetermined transistor units of the plurality of transistor units are turned off by pinch-off, and the remaining transistor units are in an ON state, a size of the transistor group of each transistor unit turned off by pinch-off when the bias voltage is lowered is set to cover output power in a high power output mode, and a size of the transistor group of each transistor unit in the ON state when the bias voltage is lowered is set to cover output power in a low power output mode, and the amplifier is designed to increase an efficiency of the transistor group in the ON state when the bias voltage is lowered in the low power output mode.

According to the eighth aspect of the present invention, there is provided a radio device using the power amplifier of any one of the first, third, and fourth aspects as an amplifier for amplifying a radio transmission output.

According to the ninth aspect of the present invention, there is provided a portable telephone using the power amplifier of any one of the first, third, and fourth aspects as an amplifier for amplifying a radio transmission output.

According to the 10th aspect of the present invention, there is provided a portable telephone comprising an antenna for transmitting/receiving a radio signal to/from a base station, a transmission/reception demultiplexer for demultiplexing transmission/reception for the antenna, a first amplifier for amplifying a reception signal from the transmission/reception demultiplexer, a first filter for filtering an output from the first amplifier, a first synthesizer for outputting a signal having a predetermined frequency, a first mixer for synthesizing an output from the first filter with an output from the first synthesizer, a second filter for filtering an output from the first mixer, a second amplifier for amplifying an output from the second filter, a second synthesizer for outputting a signal having a predetermined frequency, a demodulator for demodulating an output from the second amplifier using an output from the second synthesizer, a baseband processing section for inputting the signal demodulated by the demodulator and performing control associated with transmission/reception, a loudspeaker for generating a received voice signal controlled by the baseband processing section, a microphone controlled by the baseband processing section to collect a voice of a user, a third synthesizer for outputting a signal having a predetermined frequency, a modulator for modulating a signal from the baseband processing section using an output from the third synthesizer, a third amplifier for amplifying an output from the modulator, a third filter for filtering an output from the third amplifier, a second mixer for synthesizing an output from the third filter with an output from the first synthesizer, a fourth filter for filtering an output from the second mixer, a fourth amplifier for amplifying an output from the fourth filter and outputting the output to the transmission/reception demultiplexer, a first D/A converter for converting a first amplification factor adjustment signal from the baseband processing section into an analog signal and supplying the amplification factor adjustment signal to the second amplifier to adjust an amplification factor of the second amplifier, and a second D/A converter for converting a second amplification factor adjustment signal from the baseband processing section into an analog signal and supplying the amplification factor adjustment signal to the fourth amplifier to adjust an amplification factor of the fourth amplifier, wherein the power amplifier of one of the first, third, and fourth aspects is used as the fourth amplifier.

The power amplifier of the present invention is realized by connecting a plurality of transistor units in parallel on one semiconductor chip. When all of the bases, emitters, and collectors of the transistor units (gates, sources, and drains of FETs) are connected, and a DC operating point is changed, the operating points of all the transistor units also change.

In the present invention, each of the plurality of transistor units connected in parallel is constructed by a group of some transistors. The groups have different static characteristics and, preferably, different pinch-off voltages of FETs. With this arrangement, when the bias voltage is lowered, certain groups are set in a pinch-off state to completely reduce power consumption to zero, and the remaining groups are set in an ON state. When the size of transistors of the groups which are turned off by pinch-off first is increased, output power in the high power output mode can be maintained. When the amplifier is designed to increase, in the low output mode, the efficiency of the transistors of the groups which are not turned off by pinch-off in the low power output mode, the efficiency in the low output mode can be improved.

In the present invention, the object of the present invention can also be realized by forming transistors having the conventional size in the conventional number and adding a plurality of transistors having a small size and different static characteristics.

According to the present invention, when the power amplifier is used while continuously changing its output, complex control need not be performed, the output power has no discontinuous points, and the efficiency in the low output mode can be improved.

In addition, according to the present invention, since a circuit for adjusting the drain voltage in accordance with the change in bias voltage can be omitted, the circuit can be simplified and made compact, and it can be used in a device such as a portable telephone requiring size reduction.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Preferred embodiments of the present invention will be described below with reference to the accompanying drawings.

Figure 1:
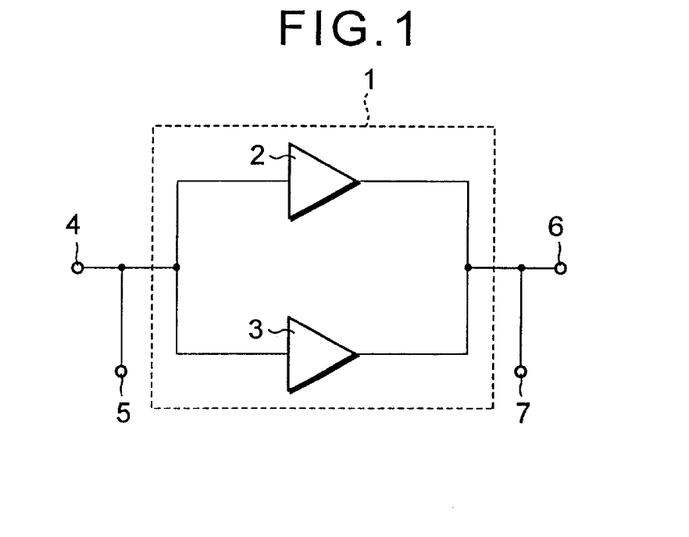
FIG. 1 is a block diagram showing the schematic arrangement of a power amplifier according to the first embodiment of the present invention.

FIG. 1 is a schematic block diagram of a power amplifier according to the first embodiment of the present invention. In this embodiment, a power amplifier comprised of FETs will be described.

A power amplifier 1 of this embodiment shown in FIG. 1 is constructed by connected transistor units 2 and 3 in parallel. Each of the transistor units 2 and 3 comprises at least one FET. The static characteristics and, preferably, pinch-off voltage of the transistor unit 2 are different from the static characteristics of the transistor unit 3.

Figure 2:
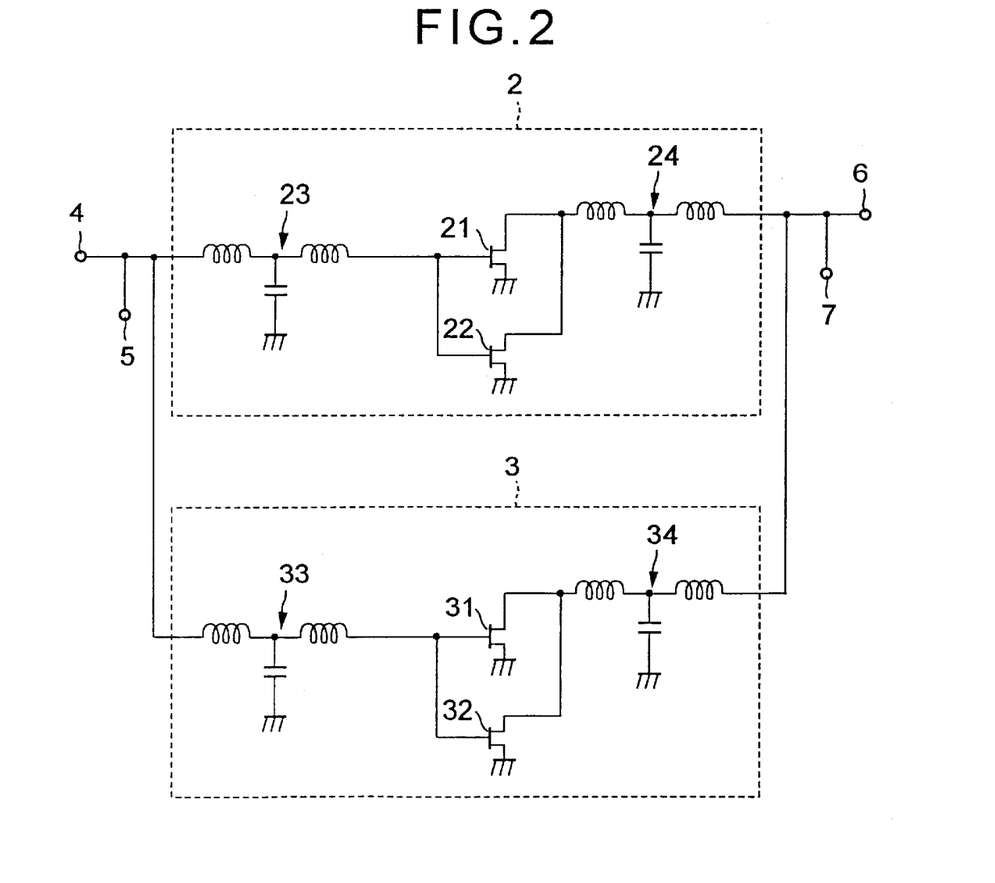
FIG. 2 is a circuit diagram showing the internal arrangement of transistor units shown in FIG. 1.

FIG. 2 is a circuit diagram showing the internal arrangement of the transistor units 2 and 3 shown in FIG. 1. Each of the transistor units 2 and 3 is comprised of two FETs.

FETs 21 and 22 in the transistor unit 2 parallelly connected to the input and output terminals. An input matching circuit 23 is connected to the input terminal, and an output matching circuit 24 is connected to the output terminal. The transistor unit 3 has the same internal arrangement as that of the transistor unit 2.

An RF signal from an RF signal input terminal 4 and a bias voltage from a bias voltage input terminal 5 are input to the transistor units 2 and 3. The RF signal amplified and output from the transistor units 2 and 3 is output from an RF signal output terminal 6. The sources of the FETs constructing the transistor units 2 and 3 are grounded. A fixed drain voltage is applied from a drain voltage input terminal 7.

When the transistor unit 2 in FIG. 1 is comprised of a plurality of FETs, the pinch-off voltages of all the plurality of FETs are equal. When the transistor unit 3 is comprised of a plurality of FETs, the pinch-off voltages of all the plurality of FETs are equal. The pinch-off voltage of the FETs used in the transistor unit 2 is different from that of the FETs used in the transistor unit 3.

Figure 3:
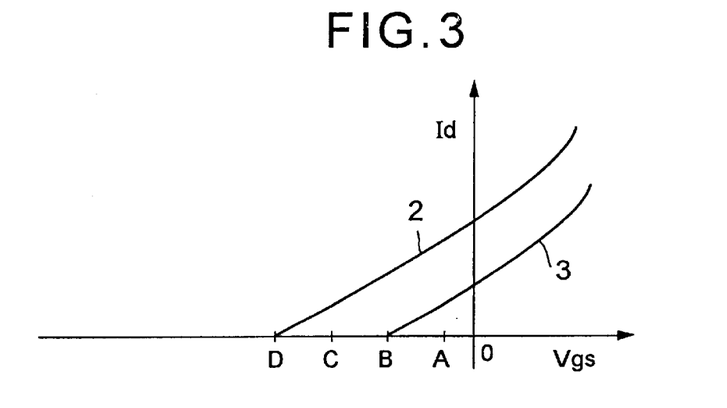
FIG. 3 is a graph showing the Vsg vs. Id characteristics as the static characteristics of the transistor units shown in FIG. 1.

FIG. 3 is a graph showing the gate-to-source current Vgs vs. a drain current Id characteristics as the static characteristics of the transistor units 2 and 3 shown in FIG. 1.

As shown in FIG. 3, the transistor units 2 and 3 have different pinch-off voltages. A point B represents the pinch-off voltage of the transistor unit 3, and a point D represents the pinch-off voltage of the transistor unit 2. For this reason, when a voltage at an operating point A is applied to the bias input terminal, both the transistor units 2 and 3 are turned on. With the voltage at an operating point C, only the transistor unit 2 is turned on.

That is, when the bias voltage is continuously changed from the point A to the point C, the transistor unit 3 is turned off by pinch-off. As will be described later about the current and output at the operating point as a reference, when the number ratio of the transistor units 2 and 3 (i.e., the ratio of the number of transistors constituting the transistor group of the transistor unit 2 to the number of transistors constituting the transistor group of the transistor unit 3) is selected, the output from the transistor group of the transistor unit 3 can be made dominant in a high output mode. In addition, in a low output mode, only the transistor group of the transistor unit 2 is operated, and unnecessary transistors are turned off to suppress an unnecessary current, thereby improving the efficiency.

Figure 4:
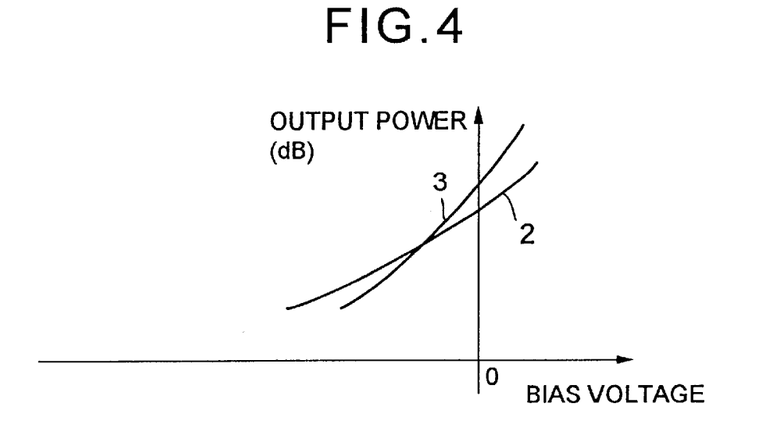
FIG. 4 is a graph showing the bias voltage vs. output power characteristics as the static characteristics of the transistor units shown in FIG. 1.

FIG. 4 is a graph showing the bias voltage vs. output power characteristics as the static characteristics of the transistor units 2 and 3 shown in FIG. 1.

Referring to FIG. 4, when the bias voltage is lowered, the main output changes from the output from the transistor unit 3 to the output from the transistor unit 2 at a certain point. From this point, the output from the transistor unit 3 abruptly decreases until pinch-off.

Figure 5:
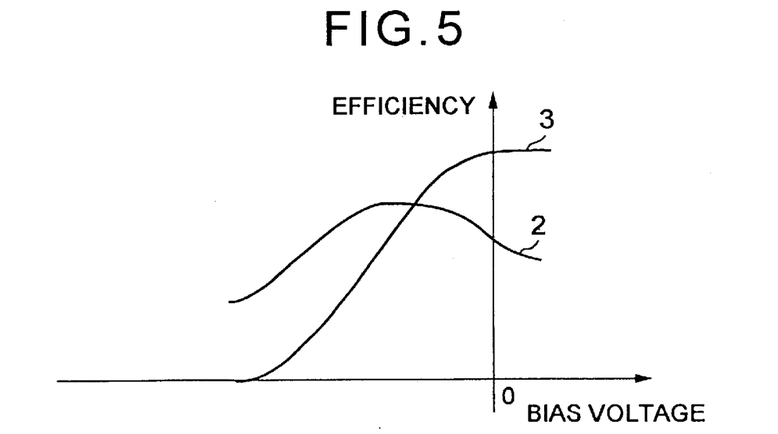
FIG. 5 is a graph showing the bias voltage vs. efficiency characteristics as the static characteristics of the transistor units shown in FIG. 1.

FIG. 5 is a graph showing the bias voltage vs. efficiency characteristics as the static characteristics of the transistor units 2 and 3 shown in FIG. 1.

Referring to FIG. 5, in the high output mode, the transistor unit 2 does not flow a large current, and therefore, the current from the transistor unit 3 is dominant. On the other hand, when the output from the transistor unit 2 becomes almost dominant, the current from the transistor unit 2 becomes dominant in the entire efficiency. When the amplifier is designed to increase the efficiency of the transistor unit 2 near that point, the decrease in the entire efficiency due to a decrease in magnitude of the bias voltage can be minimized.

The number of transistors constituting the transistor group of the transistor unit 2 is set such that a desired amplification factor is obtained in the low output mode after the transistor unit 3 is turned off by pinch-off at the point B shown in FIG. 3. The number of transistors constituting the transistor group of the transistor unit 3 is set such that a desired amplification factor is obtained in the high output mode.

As described above, according to this embodiment, a power amplifier which does not decrease the efficiency throughout the high and low output modes.

In the above-described embodiment, transistor units like the transistor units 2 and 3 having different pinch-off voltages are used to form the power amplifier. The transistor units having different pinch-off voltages can be formed on different semiconductor chips or on one semiconductor chip. Transistors units, e.g., depletion FETs having different pinch-off voltages can be formed on one semiconductor chip by partially changing the number of times of ion implantation into channels. More specifically, the channel depth at a portion where ion implantation has been performed a larger number of times increases. A transistor with a thicker channel layer has a lower pinch-off voltage. With this method, transistor units having different pinch-off voltages can be formed on one semiconductor chip.

In the above-described embodiment, any semiconductor such as GaAs and silicon can be effectively used.

The power amplifier circuit of the present invention can provide its effect especially in application to the transmission section of a cellular phone. This will be described below.

Figure 6:
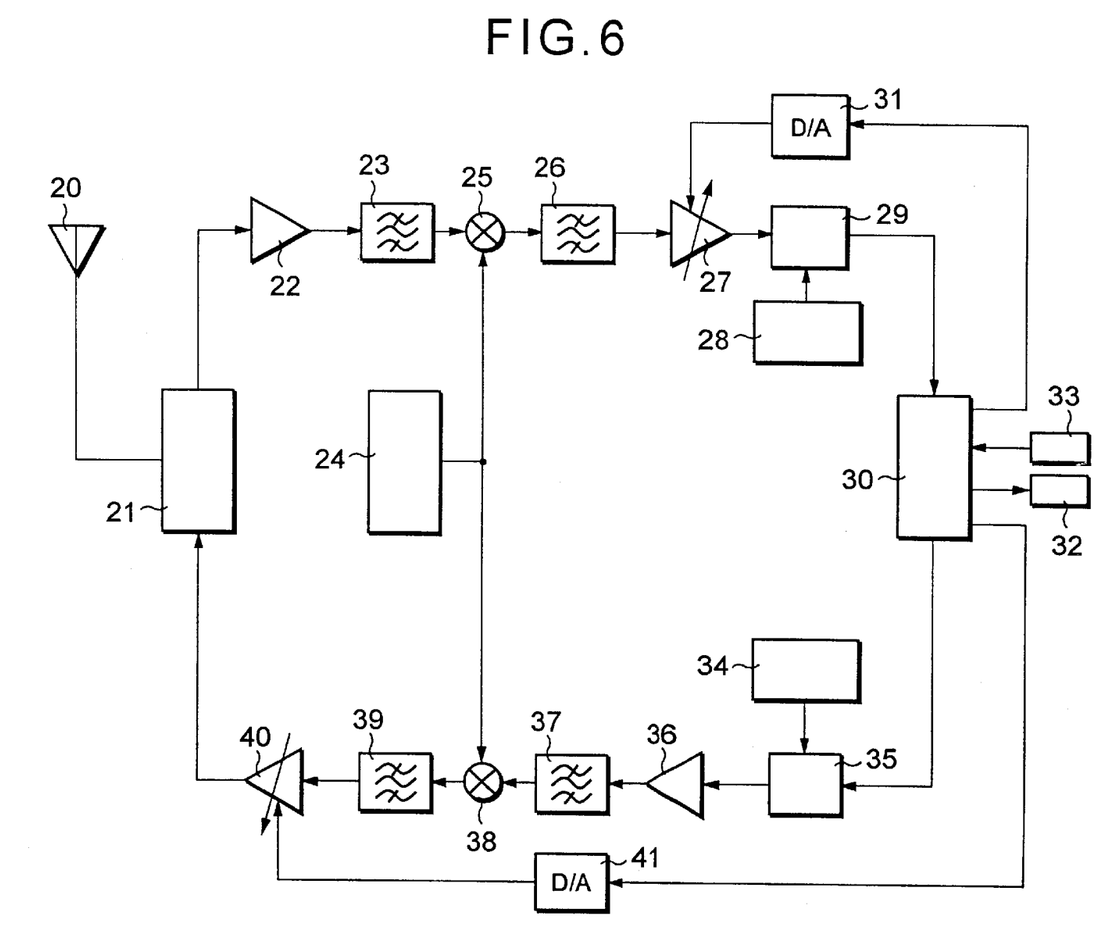
FIG. 6 is a block diagram showing the schematic arrangement of a portable telephone to which the power amplifier of the present invention is applied.

FIG. 6 is a block diagram showing the schematic arrangement of a portable telephone to which the power amplifier circuit of the present invention is applied.

Referring to FIG. 6, an antenna 20 transmits/receives a radio signal to/from a base station. The transmission/reception wave is demultiplexed by a transmission/reception demultiplexer 21. A received signal from the transmission/reception demultiplexer 21 is amplified by a first amplifier 22 and filtered by a first filter 23. A first synthesizer 24 outputs a signal having a predetermined frequency. A first mixer 25 synthesizes the output from the first filter 23 with the output from the first synthesizer 24. A second filter 26 filters the output from the first mixer 25. A second amplifier 27 amplifies the output from the second filter 26 with an amplification factor based on the output from a first D/A converter 31. A second synthesizer 28 outputs a signal having a predetermined frequency. A demodulator 29 demodulates the output from the second amplifier 27 using the output from the second synthesizer 28.

A baseband processing section 30 performs control associated with transmission/reception of the portable telephone. The baseband processing section 30 outputs the output from the demodulator 29 through a loudspeaker 32 as a voice signal. The baseband processing section 30 also collects the voice of the user of the portable telephone with a microphone 33 and outputs it to a modulator 35 as a transmission signal. The baseband processing section 30 outputs an amplification factor adjustment signal for instructing the amplification factors of the second amplifier 27 and a fourth amplifier 40. The amplification factor adjustment signal to the second amplifier 27 is converted into an analog signal by the first D/A converter 31 and supplied to the second amplifier 27. The amplification factor adjustment signal to the fourth amplifier 40 is converted into an analog signal by a second D/A converter 41 and supplied to the fourth amplifier 40.

A third synthesizer 34 outputs a signal having a predetermined frequency. The modulator 35 modulates the signal from the baseband processing section 30 using the output from the third synthesizer 34. The output from the modulator 35 is amplified by a third amplifier 36 and filtered by a third filter 37. A second mixer 38 synthesizes the output from the third filter 37 with the output from the output matching circuit 24. A fourth filter 39 filters the output from the second mixer 38. The fourth amplifier 40 amplifies the output from the fourth filter 39 with an amplification factor based on the output from the second D/A converter 41. The output from the fourth amplifier 40 is supplied to the transmission/reception demultiplexer 21 as a transmission signal.

In the portable telephone shown in FIG. 6, the power amplifier according to the present invention can be applied to, e.g., the fourth amplifier 40. In this case, the amplification factor adjustment signal converted into an analog signal by the second D/A converter 41 is applied to the bias voltage input terminal 5 shown in FIG. 1.

For example, in a CDMA portable telephone system, when a signal transmitted from a portable telephone is received, the base station instructs the portable telephone to adjust the transmission power such that the reception power has a desired value. This instruction is transmitted to the portable telephone through a control channel or a speech communication channel using a conventionally known method such as an open loop or a closed loop. In the portable telephone, the baseband processing section 30 shown in FIG. 6 generates the above-described amplification factor adjustment signal on the basis of the transmission power adjustment instruction.

The base station of a mobile communication system preferably receives reception signals from a plurality of portable telephones at almost the same intensity. Especially in the CDMA portable telephone system, if the intensities of reception signals from a plurality of portable telephones are different, the number of speech communication channels that can be ensured decreases. For this reason, the transmission section of a portable telephone must adjust the transmission output in accordance with the factor such as the distance from the base station. In addition, portable telephones are often used in the low output mode when the users of the portable telephones are near the base station. For this reason, it is the challenge of the power amplifier of the transmission section of a portable telephone to improve the efficiency in the low output mode.

The power amplifier of the present invention can improve the efficiency in the low output mode, as described above. Hence, when the power amplifier of the present invention is used as the fourth amplifier 40 shown in FIG. 6, a great effect can be obtained.

A power amplifier according to the second embodiment of the present invention will be described next with reference to the accompanying drawings.

Figure 7:
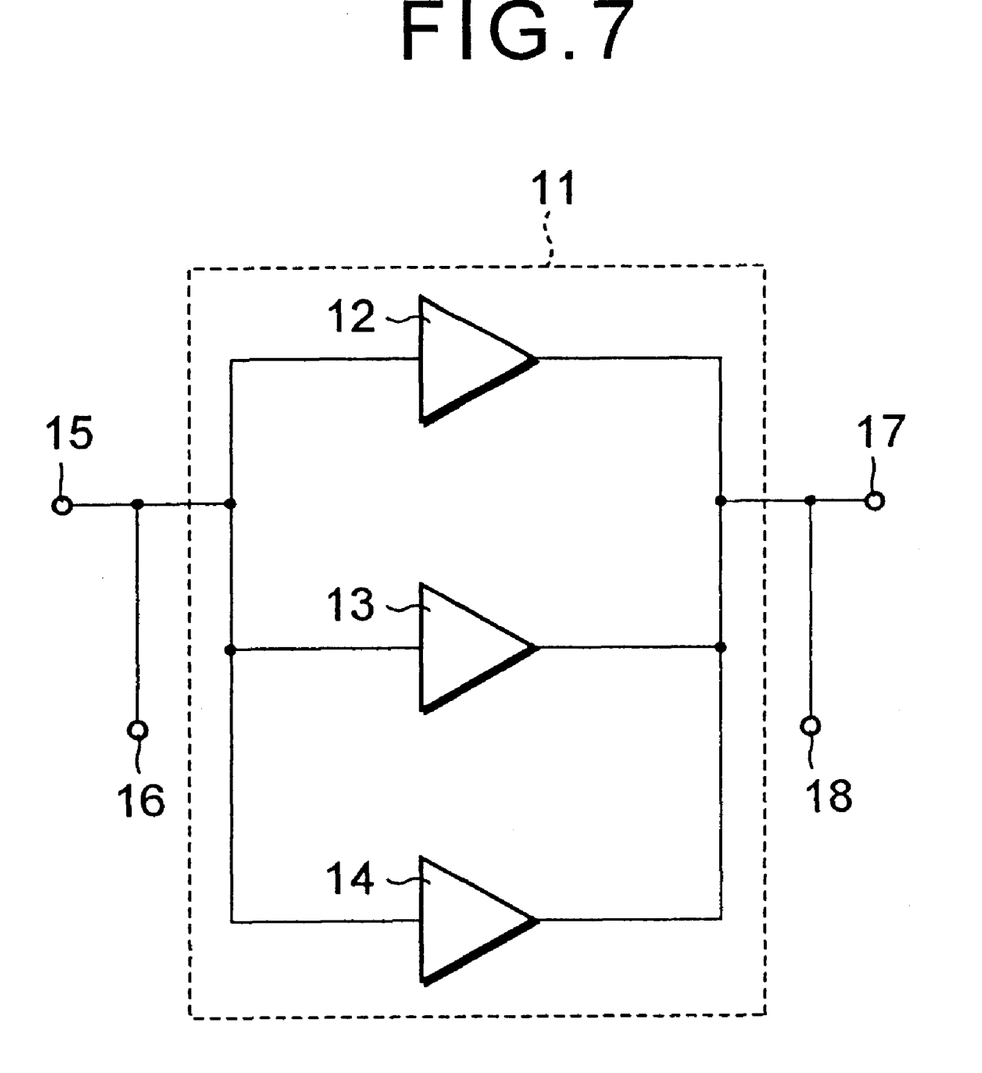
FIG. 7 is a block diagram showing the schematic arrangement of a power amplifier according to the second embodiment of the present invention.

FIG. 7 is a block diagram showing the schematic arrangement of a power amplifier according to the second embodiment of the present invention. In this embodiment, a power amplifier constructed by FETs will be described.

A power amplifier 11 of this embodiment shown in FIG. 7 is constructed by connecting a transistor unit 12, a transistor unit 13, and a transistor unit 14 in parallel. Each of the transistor units 12, 13, and 14 comprises one or more FETs.

Figure 8:
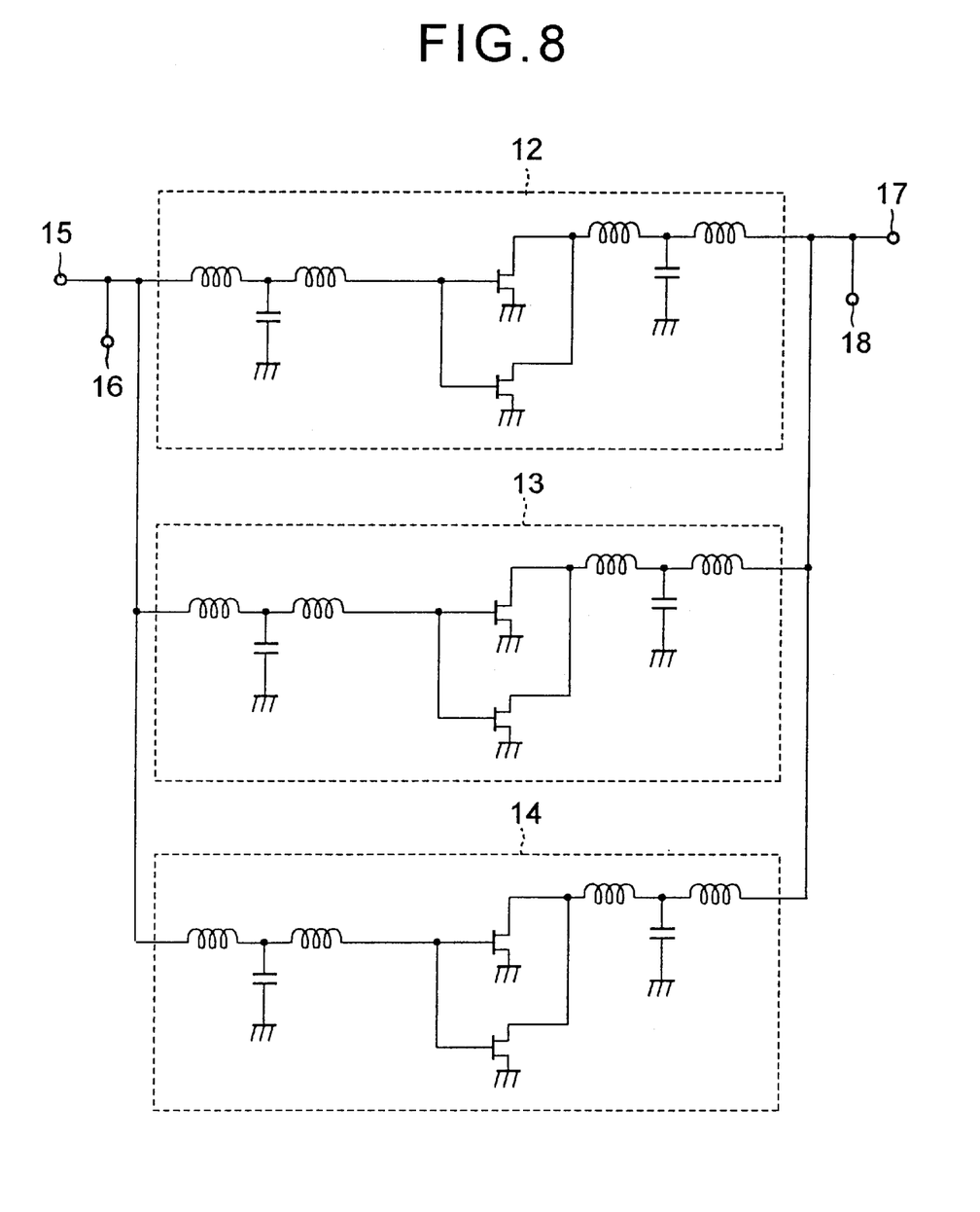
FIG. 8 is a circuit diagram showing the internal arrangement of transistor units shown in FIG. 7.

FIG. 8 is a circuit diagram showing the internal arrangement of the transistor units 12, 13, and 14 shown in FIG. 7. Each of the transistor units 12, 13, and 14 comprises two FETs.

An RF signal is input from an RF signal input terminal 15 to the transistor units 12, 13, and 14. A bias voltage is input from a bias voltage input terminal 16. The RF signals amplified and output from the transistor units 12, 13, and 14 are output from an RF signal output terminal 17. The sources of the FETs constructing the transistor units 12, 13, and 14 are grounded. A fixed drain voltage is applied from a drain voltage input terminal 18.

Referring to FIG. 7, when the transistor unit 12 is comprised of a plurality of FETs, the pinch-off voltages of all the plurality of FETs are equal. When the transistor unit 13 is comprised of a plurality of FETs, the pinch-off voltages of all the plurality of FETs are equal. When the transistor unit 14 is comprised of a plurality of FETs, the pinch-off voltages of all the plurality of FETs are equal. The pinch-off voltage of the FETs used in the transistor unit 12, that of the FETs used in the transistor unit 13, and that of the FETs used in the transistor unit 14 are different from each other.

Figure 9:
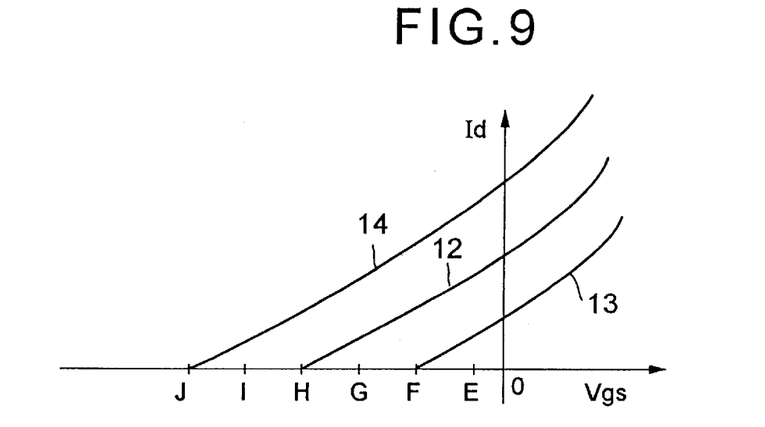
FIG. 9 is a graph showing the Vsg vs. Id characteristics as the static characteristics of the transistor units shown in FIG. 7.

FIG. 9 is a graph showing the gate-to-source current Vgs vs. drain current Id characteristics as the static characteristics of the transistor units 12, 13, and 14 shown in FIG. 7.

As shown in FIG. 9, the pinch-off voltages of the transistor units 12, 13, and 14 are different from each other. A point F represents the pinch-off voltage of the transistor unit 13. A point H represents the pinch-off voltage of the transistor unit 12. A point J represents the pinch-off voltage of the transistor unit 14. When the voltage at a point A is applied to the bias input terminal, all of the transistor units 12, 13, and 14 are turned on. With the voltage at a point G, the transistor units 12 and 14 are turned on. With the voltage at a point I, only the transistor unit 14 is turned on.

That is, when the bias voltage is continuously changed from a point E to the point I, the transistor units 13 and 12 are turned off by pinch-off in the order named. When the number ratio of the transistor units 12, 13, and 14 is selected by the same method as in the first embodiment, the output from the transistor group in the transistor unit 13 can be made dominant in the high output mode. In the lowest output mode, only the transistor unit 14 operates, and unnecessary transistors are turned off to suppress the unnecessary current. Hence, the efficiency can be improved.

Figure 10:
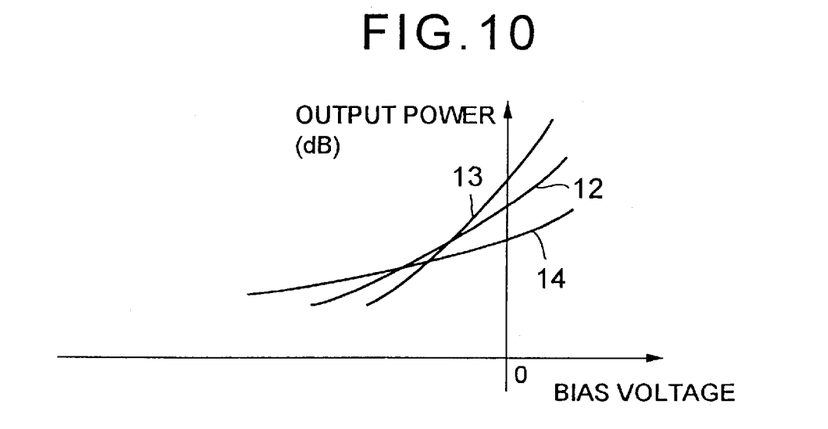
FIG. 10 is a graph showing the bias voltage vs. output power characteristics as the static characteristics of the transistor units shown in FIG. 7.

FIG. 10 is a graph showing the bias voltage vs. output power characteristics as the static characteristics of the transistor units 12, 13, and 14 shown in FIG. 7.

Referring to FIG. 10, when the bias voltage is lowered, the main output changes from the output from the transistor unit 13 to the output from the transistor unit 12 at a certain point. From this point, the output from the transistor unit 13 abruptly decreases until pinch-off. When the bias voltage is further lowered, the main output changes from the output from the transistor unit 12 to the output from the transistor unit 14 at a certain point. From this point, the output from the transistor unit 12 abruptly decreases until pinch-off.

Figure 11:
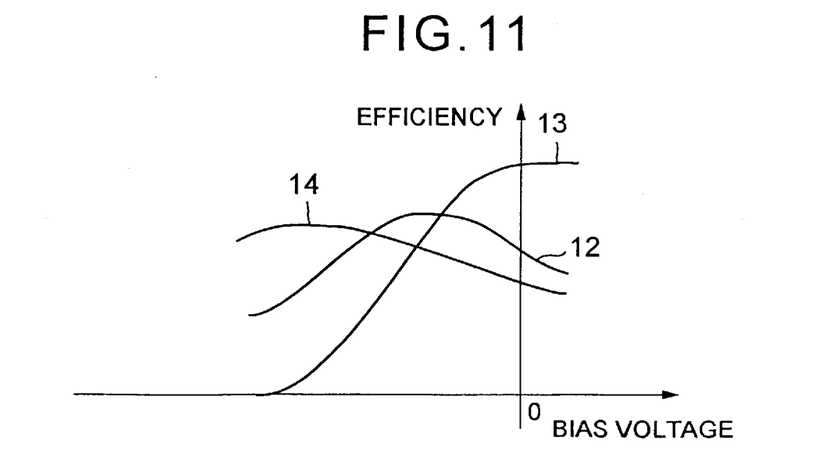
FIG. 11 is a graph showing the bias voltage vs. efficiency characteristics as the static characteristics of the transistor units shown in FIG. 7.

FIG. 11 is a graph showing the bias voltage vs. efficiency characteristics as the static characteristics of the transistor units 12, 13, and 14 shown in FIG. 7.

Referring to FIG. 11, in the high output mode, the transistor units 12 and 14 do not flow a large current, and therefore, the current from the transistor unit 13 is dominant. On the other hand, when the output from the transistor unit 12 becomes almost dominant, the current from the transistor unit 12 becomes dominant in the entire efficiency. When the amplifier is designed to increase the efficiency of the transistor unit 12 near that point, the decrease in the entire efficiency due to a decrease in magnitude of the bias voltage can be minimized. In addition, when the output from the transistor unit 14 becomes almost dominant, the current from the transistor unit 14 becomes dominant in the entire efficiency. When the amplifier is designed to increase the efficiency of the transistor unit 14 near that point, the decrease in the entire efficiency due to a decrease in magnitude of the bias voltage can be minimized.

As described above, according to the second embodiment, a power amplifier which does not decrease the efficiency throughout the high and low output modes. Additionally, the second embodiment allows finer efficiency improvement than in the first embodiment.

In the above-described second embodiment, transistor units like the transistor units 12, 13, and 14 having different pinch-off voltages are used to form the power amplifier. The transistor units having different pinch-off voltages can be formed on different semiconductor chips or on one semiconductor chip. Transistors units, e.g., depletion FETs having different pinch-off voltages can be formed on one semiconductor chip by partially changing the number of times of ion implantation into channels. More specifically, the channel depth at a portion where ion implantation has been performed a larger number of times increases. A transistor with a thicker channel layer has a lower pinch-off voltage. With this method, transistor units having different pinch-off voltages can be formed on one semiconductor chip.

In the above-described embodiment, any semiconductor such as GaAs and silicon can be effectively used.

What is claimed is:

1. A portable telephone comprising:

an antenna for transmitting/receiving a radio signal to/from a base station;

a transmission/reception demultiplexer for demultiplexing transmission/reception for said antenna;

a first amplifier for amplifying a reception signal from said transmission/reception demultiplexer;

a first filter for filtering an output from said first amplifier;

a first synthesizer for outputting a signal having a predetermined frequency;

a first mixer for synthesizing an output from said first filter with an output from said first synthesizer;

a second filter for filtering an output from said first mixer;

a second amplifier for amplifying an output from said second filter;

a second synthesizer for outputting a signal having a predetermined frequency;

a demodulator for demodulating an output from said second amplifier using an output from said second synthesizer;

a baseband processing section for inputting the signal demodulated by said demodulator and performing control associated with transmission/reception;

a loudspeaker for generating a received voice signal controlled by said baseband processing section;

a microphone controlled by said baseband processing section to collect a voice of a user;

a third synthesizer for outputting a signal having a predetermined frequency;

a modulator for modulating a signal from said baseband processing section using an output from said third synthesizer;

a third amplifier for amplifying an output from said modulator;

a third filter for filtering an output from said third amplifier;

a second mixer for synthesizing an output from said third filter with an output from said first synthesizer;

a fourth filter for filtering an output from said second mixer;

a fourth amplifier for amplifying an output from said fourth filter and outputting the output to said transmission/reception demultiplexer, said fourth amplifier comprising a plurality of transistor units connected in parellel and having different static characteristics;

a first D/A converter for converting a first amplification factor adjustment signal from said baseband processing section into an analog signal and supplying the amplification factor adjustment signal to said second amplifier to adjust an amplification factor of said second amplifier; and a second D/A converter for converting a second amplification factor adjustment signal from said baseband processing section into an analog signal and supplying the amplification factor adjustment signal to said fourth amplifier to adjust an amplification factor of said fourth amplifier.

2. A portable telephone comprising:

an antenna for transmitting/receiving a radio signal to/from a base station;

a transmission/reception demultiplexer for demultiplexing transmission/reception for said antenna;

a first amplifier for amplifying a reception signal from said transmission/reception demultiplexer;

a first filter for filtering an output from said first amplifier;

a first synthesizer for outputting a signal having a predetermined frequency;

a first mixer for synthesizing an output from said first filter with an output from said first synthesizer;

a second filter for filtering an output from said first mixer;

a second amplifier for amplifying an output from said second filter;

a second synthesizer for outputting a signal having a predetermined frequency;

a demodulator for demodulating an output from said second amplifier using an output from said second synthesizer;

a baseband processing section for inputting the signal demodulated by said demodulator and performing control associated with transmission/reception;

a loudspeaker for generating a received voice signal controlled by said baseband processing section;

a microphone controlled by said baseband processing section to collect a voice of a user;

a third synthesizer for outputting a signal having a predetermined frequency;

a modulator for modulating a signal from said baseband processing section using an output from said third synthesizer;

a third amplifier for amplifying an output from said modulator;

a third filter for filtering an output from said third amplifier;

a second mixer for synthesizing an output from said third filter with an output from said first synthesizer;

a fourth filter for filtering an output from said second mixer;

a fourth amplifier for amplifying an output from said fourth filter and outputting the output to said transmission/reception demultiplexer, said fourth amplifier comprising a plurality of transistor units connected in parallel and having different pinch-off voltages, and when a bias voltage applied to said plurality of transistor units is lowered, predetermined transistor units of said plurality of transistor units are turned off by pinch-off, and the remaining transistor units are in an ON state;

a first D/A converter for converting a first amplification factor adjustment signal from said baseband processing section into an analog signal and supplying the amplification factor adjustment signal to said second amplifier to adjust an amplification factor of said second amplifier; and a second D/A converter for converting a second amplification factor adjustment signal from said baseband processing section into an analog signal and supplying the amplification factor adjustment signal to said fourth amplifier to adjust an amplification factor of said fourth amplifier.

3. A portable telephone comprising:

an antenna for transmitting/receiving a radio signal to/from a base station;

a transmission/reception demultiplexer for demultiplexing transmission/reception for said antenna;

a first amplifier for amplifying a reception signal from said transmission/reception demultiplexer;

a first filter for filtering an output from said first amplifier;

a first synthesizer for outputting a signal having a predetermined frequency;

a first mixer for synthesizing an ontput from said first filter with an output from said first synthesizer;

a second filter for filtering an output from said first mixer;

a second amplifier for amplifying an output from said second filter;

a second synthesizer for outputting a signal having a predetermined frequency;

a demodulator for demodulating an output from said second amplifier using an output from said second synthesizer;

a baseband processing section for inputting the signal demodulated by said demodulator and performing control associated with transmission/reception;

a loudspeaker for generating a received voice signal controlled by said baseband processing section;

a microphone controlled by said baseband processing section to collect a voice of a user;

a third synthesizer for outputting a signal having a predetermined frequency;

a modulator for modulating a signal from said baseband processing section using an output from said third synthesizer;

a third amplifier for amplifying an output from said modulator;

a third filter for filtering an output from said third amplifier;

a second mixer for synthesizing an output from said third filter with an output from said first synthesizer;

a fourth filter for filtering an output from said second mixer;

a fourth amplifier for amplifying an output from said fourth filter and outputting the output to said transmission/reception demultiplexer, said fourth amplifier comprising a plurality of transistor units connected in parallel through a matching circuit and having different pinch-off voltages, and when a bias voltage applied to said plurality of transistor units is lowered, predetermined transistor units of said plurality of transistor units are turned off by pinch-off, and the remaining transistor units are in an ON state;

a first D/A converter for converting a first amplification factor adjustment signal from said baseband processing section into an analog signal and supplying the amplification factor adjustment signal to said second amplifier to adjust an amplification factor of said second amplifier; and a second D/A converter for converting a second amplification factor adjustment signal from said baseband processing section into an analog signal and supplying the amplification factor adjustment signal to said fourth amplifier to adjust an amplification factor of said fourth amplifier.

* * * * *